United States Patent
Do

(10) Patent No.: US 6,985,011 B1
(45) Date of Patent: Jan. 10, 2006

(54) METHOD OF REDUCING THE NUMBER OF CONFIGURATION BITS BY ELIMINATING THE UNUSED CONFIGURATION BITS

(75) Inventor: Toan D. Do, San Jose, CA (US)

(73) Assignee: Altera Corporation, San Jose, CA (US)

( * ) Notice: Subject to any disclaimer, the term of this patent is extended or adjusted under 35 U.S.C. 154(b) by 56 days.

(21) Appl. No.: 10/738,811

(22) Filed: Dec. 16, 2003

(51) Int. Cl.
    *H03K 19/177* (2006.01)
(52) U.S. Cl. .............................. 326/38; 326/41; 716/16
(58) Field of Classification Search .................... None
    See application file for complete search history.

(56) References Cited

U.S. PATENT DOCUMENTS 5,773,993 A * 6/1998 Trimberger .................. 326/38
6,150,839 A * 11/2000 New et al. .................... 326/40
6,201,406 B1 * 3/2001 Iwanczuk et al. ............. 326/38

* cited by examiner

*Primary Examiner*—James H. Cho
(74) *Attorney, Agent, or Firm*—Townsend and Townsend and Crew LLP

(57) ABSTRACT

Apparatus and method configures a programmable logic device (PLD). The method includes reading a first configuration frame from the PLD. The first configuration frame indicates used and unused bit positions. The method further includes reading a second configuration frame from a memory. The second configuration frame is related to the first configuration frame. The method further includes creating a third configuration frame by placing information from the second configuration frame into positions indicated by the first configuration frame. The method further includes configuring the PLD using the third configuration frame. In this manner, the second configuration frame may occupy less space in the memory, and may be read more quickly, than a frame that also included position information.

16 Claims, 3 Drawing Sheets

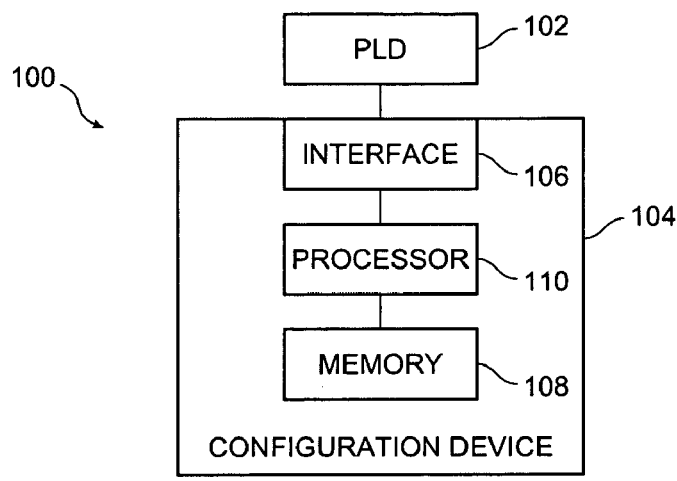
FIG. 1
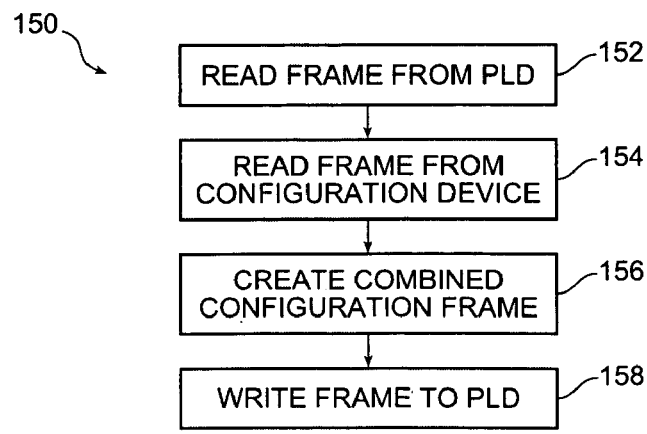
FIG. 2
FIG. 3
FIG. 6

US 6,985,011 B1

METHOD OF REDUCING THE NUMBER OF CONFIGURATION BITS BY ELIMINATING THE UNUSED CONFIGURATION BITS

CROSS-REFERENCES TO RELATED APPLICATIONS

Not Applicable.

STATEMENT AS TO RIGHTS TO INVENTIONS MADE UNDER FEDERALLY SPONSORED RESEARCH OR DEVELOPMENT

Not Applicable.

REFERENCE TO A "SEQUENCE LISTING," A TABLE, OR A COMPUTER PROGRAM LISTING APPENDIX SUBMITTED ON A COMPACT DISK

Not Applicable.

BACKGROUND OF THE INVENTION

The present invention relates to programmable logic device (PLD) configuration.

PLDs are integrated circuit devices with a variety of functional blocks that may be connected together in various ways in order to use the PLD appropriately in a wide variety of different applications. Some examples of the functional blocks are memories, processors, digital signal processors (DSPs), phase-locked loops (PLLs), logic elements (LEs), logic array blocks (LABs), etc. The functional blocks are connected via an interconnect. The PLD may be configured to use selected ones of the functional blocks in a selected way for a particular application. One way to configure the PLD is to use "configuration bits". Configuration bits are used to configure the PLD. Some examples of configurations that may be performed are to program the interconnects, to enable certain functions in the logic elements (LEs), etc.

Some concerns arise regarding "unused" or "blank" configuration bits. Such blank configuration bits are not used to configure the PLD, but are still stored in the configuration device (an external memory used to download the configuration bits into the PLD). The blank configuration bits are stored in the configuration device so that the PLD can be configured by just shifting in the configuration bits frame by frame. One concern is that as the PLD gets bigger, the number of configuration bits increases. This also increases the number of blank configuration bits. Such blank configuration bits take up space in the memory of the configuration device. Such blank configuration bits also take time to program into the PLD.

There is a need for a configuration device that has an increased available memory size as compared to a configuration device that must store blank configuration bits. There is a need for a configuration device that does not waste time programming blank configuration bits into a PLD.

The present invention is directed toward improving these and other issues regarding configuration devices for PLDs.

BRIEF SUMMARY OF THE INVENTION

Aspects of the present invention are directed toward reading information from the PLD and using that information to build the configuration array for configuring the PLD.

According to one embodiment of the present invention, a method performed by a PLD and a configuration device configures the PLD. The method includes reading a first configuration frame from the PLD, wherein the first configuration frame indicates used and unused bit positions. The method further includes reading a second configuration frame from a memory, wherein the second configuration frame is related to the first configuration frame. The method further includes creating a third configuration frame by placing information from the second configuration frame into positions indicated by the first configuration frame. The method further includes configuring the PLD using the third configuration frame. These steps may be repeated for each configuration frame in a configuration array. The first configuration frame indicates positions to pad or shift in bits from the second configuration frame.

According to another embodiment of the present invention, an apparatus configures a PLD. The apparatus includes a memory and a processor. The memory stores a first configuration frame. The processor is coupled to the memory. The processor may be a component of the PLD. The processor executes processing that includes reading a second configuration frame from the PLD, wherein the second configuration frame indicates a plurality of used and unused bits. The processing further includes reading, from the memory, the first configuration frame, wherein the first configuration frame is related to the second configuration frame. The processing further includes creating a third configuration frame by placing information from the first configuration frame into positions indicated by the second configuration frame. The processing further includes configuring the PLD using the third configuration frame.

The elements of a PLD are often arranged in an array in which a particular row includes the same blank configuration bits as a nearby row. In such a case, a single configuration frame can be read to determine the position of the blank configuration bits for more than one row, reducing the need to read multiple configuration frames with the same position information. This saves configuration time.

Embodiments of the present invention thereby result in a configuration device that has an increased available memory size, and a configuration device that need not waste time programming blank configuration bits into a PLD.

Further details are provided in the following drawings and detailed description.

BRIEF DESCRIPTION OF THE DRAWINGS

FIG. 1 is a block diagram of a system for configuring a PLD according to an embodiment of the present invention.

FIG. 2 is a diagram of a configuration bit stream with "blanked" or "unused" bits.

FIG. 3 is a diagram of a configuration bit stream with "blanked" or "unused" bits removed.

FIG. 6 is a flow diagram of a method according to an embodiment of the present invention.

DETAILED DESCRIPTION OF THE INVENTION

Figure 4:
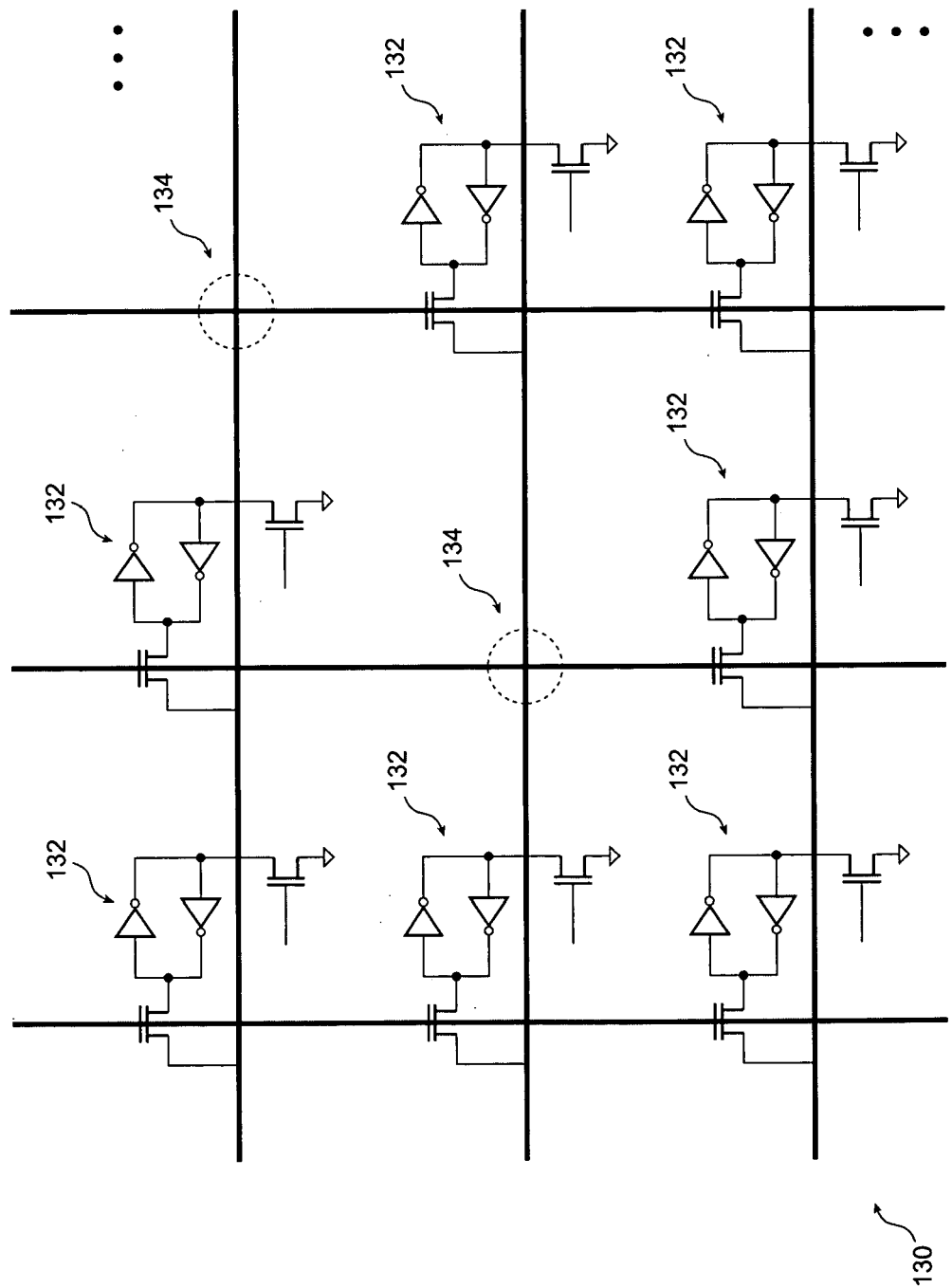
FIG. 4 is a diagram of a configuration array with "blanked" or "unused" bits.

FIG. 1 is a block diagram of a system 100 for configuring a PLD according to an embodiment of the present invention. The system 100 includes a PLD 102 and a configuration device 104. The configuration device 104 includes an interface 106, a memory 108, and a processor 110. The interface 106 interfaces the configuration device 104 with the PLD 102. The memory stores configuration information to be programmed into the PLD 102. The processor 110 controls the operation of the configuration device 104, as more fully described below.

According to another embodiment, the configuration device 104 includes the memory 108, and the PLD 102 includes the processor 110.

FIG. 2 is a diagram of a configuration bit stream 120 with "blanked" or "unused" bits. In the bit stream, the bits "1" and "0" signify their usual values, and the bit "B" signifies a blank bit. The bit stream is organized as a series of configuration frames that together correspond to a configuration array. As shown in FIG. 2, each of the three rows corresponds to a configuration frame. The number of bits in the configuration bit stream, the number of bits in each configuration frame, the number of configuration frames in the configuration bit stream, etc., may all vary according to the values that are to be configured in the PLD.

FIG. 3 is a diagram of a configuration bit stream 122 with "blanked" or "unused" bits removed. As compared to the bit stream 120 (see FIG. 2), note that the bit stream 122 has fewer bits. As such, the bit stream 122 may take up less memory space than the bit stream 120. In addition, the bit stream 122 may take less time to read or write (as appropriate) as compared to the bit stream 120.

FIG. 4 is a diagram of a portion of a configuration array 130 with "blanked" or "unused" bits. The configuration array 130 is part of the PLD 102. The configuration array 130 is where the configuration bits are loaded. The array junctures into which configuration bits may be stored have gate structures 132. The array junctures 134 are empty and do not have the gate structures 132. Configuration bits are not stored in the empty junctures 134.

Although the portion of the configuration array 130 shown in FIG. 4 is three rows and three columns, the dimensions of the configuration array 130 may vary according to the particular PLD 102.

Figure 5:
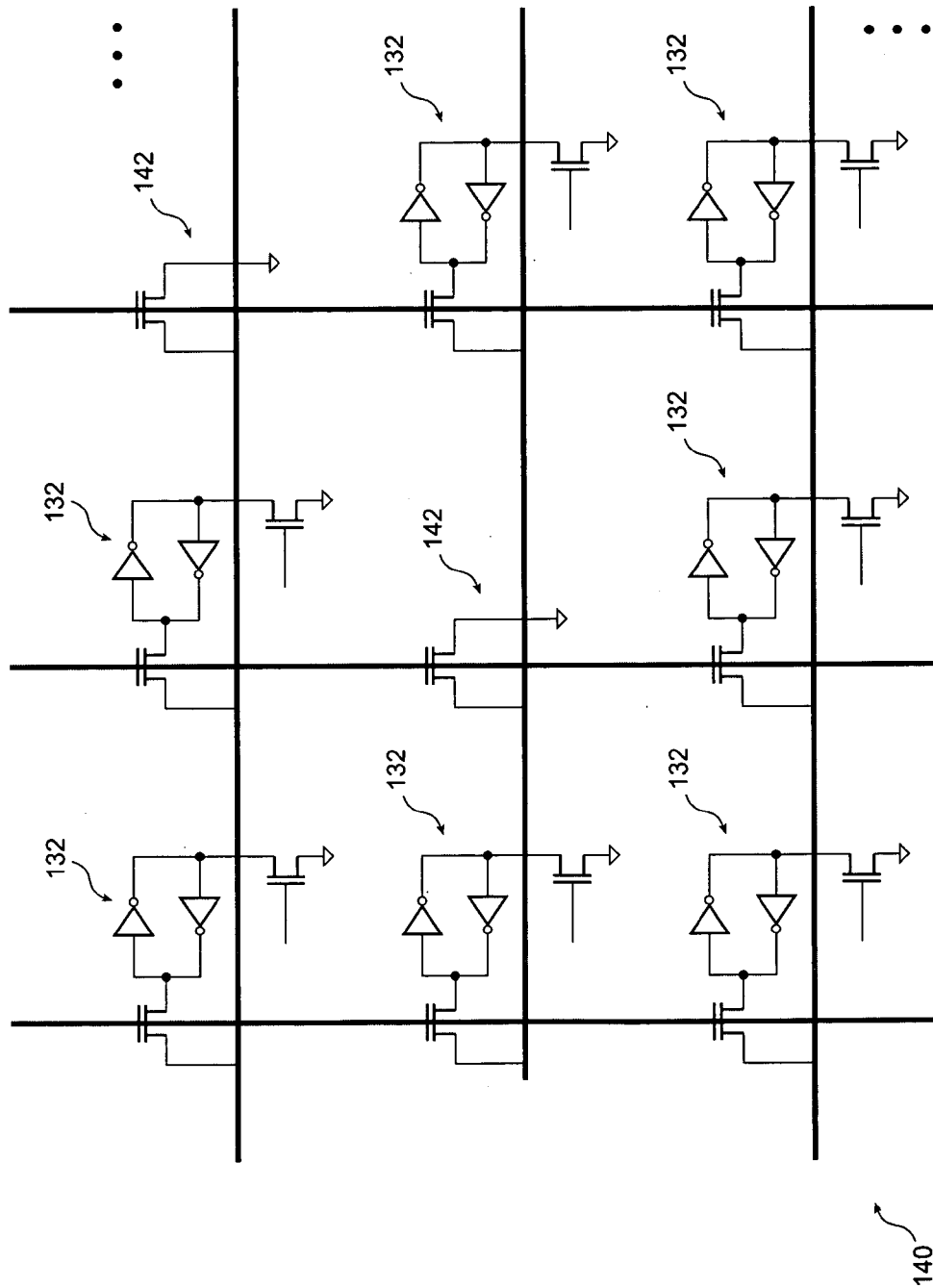
FIG. 5 is a diagram of a configuration array with "blanked" or "unused" bits removed.

FIG. 5 is a diagram of a portion of a configuration array 140 with "blanked" or "unused" bits removed. The configuration array 140 is similar to the configuration array 130. However, instead of the empty junctures 134 (that is, the array junctures without the gate structures 132), the configuration array 140 has gate structures 142. The gate structures 142 just store a value of "1". Thus, there is no need to program any different values into the gate structures 142.

FIG. 6 is a flow diagram of a method 150 according to an embodiment of the present invention. The method may be performed by the processor 110, which may be in the configuration device 104 (see FIG. 1) or in the PLD 102 (an alternate embodiment).

In step 152, the processor 110 reads the configuration frame from the PLD 102. The configuration frame read is from the configuration array 140 (see FIG. 5) in the PLD 102. This configuration frame indicates the positions of used and unused configuration bits. The "blanked" or "unused" bits will be read as "1", and the bits used for storing configuration bits will be read as "0".

The PLD 102 often includes an array of LABs, which may each have used and unused configuration bits in the same positions as all the rest. In such a case, instead of duplicating configuration frames, one configuration frame may be used with an indicator that its information should apply to more than one LAB. This further saves configuration time.

In step 154, the processor 110 reads the configuration frame stored by the configuration device 104. The configuration frame read is from the configuration bit stream 122 (see FIG. 3) in the memory 108. The configuration bit stream 122 does not include any "blank" or "unused" bits. The "blank" or "unused" bits have been removed. Thus, the configuration bit stream 122 may occupy less space in the memory 108 than a bit stream that includes blank bits. The time taken to read the configuration bit stream 122 from the memory 108 may also be reduced as compared to reading a bit stream that includes blank bits.

The order in which steps 152 and 154 may be performed may vary according to implementation. In some implementations, step 152 may be performed before step 154. In other implementations, step 154 may be performed before step 152. In other implementations, step 152 may be performed concurrently with step 154; for example, bits in the configuration frames may be read in an interleaved or alternating manner.

In step 156, the processor 110 creates a combined configuration frame, using the configuration frame from the PLD 102 (see step 152) and the configuration frame from the configuration device 104 (see step 154). As discussed above, the configuration frame from the configuration device 104 contains the configuration information ("I") to be put into the combined configuration frame, and the configuration frame from the PLD 102 contains the position information ("P") into which the configuration information is to be placed in the combined configuration frame. That is, the position information P indicates whether either a "blank" bit, or a particular bit from the configuration information I, is to be put into the combined configuration frame.

For example, assuming that the configuration information I is 1 0 1 0 1 1 0 and that the position information P is 0 0 1 0 1 0 0 0 then the combined configuration frame would be 1 0 B 1 B 0 1 1 0

That is, since the third bit of the position information is a "1", a "blank" or "unused" bit should be inserted after the second bit of the configuration information. This makes the third bit of the configuration information the fourth bit in the combined configuration frame. Similarly, since the fifth bit of the position information is a "1", a "blank" or "unused" bit should be inserted after the third bit of the configuration information. This makes the fourth bit of the configuration information the sixth bit of the combined configuration frame. The insertion of "blank" bits may also be referred to as "padding" or "shifting".

In step 158, the processor 110 writes the combined configuration frame to the PLD 102. This step may also be referred to as configuring the PLD 102. If the combined configuration frame includes all the configuration information from the configuration bit stream, then the process of providing the configuration information to the PLD 102 is complete. If not, additional configuration frames may be read and additional combined configuration frames may be generated in accordance with steps 152, 154 and 156 as discussed above.

For example, when the configuration array of the PLD 102 is expecting 1024 configuration bits organized as 32 configuration frames of 32 bits each, each of the steps 152, 154 and 156 may be performed 32 times to result in 32 combined configuration frames. Each of the 32 may be provided to the PLD 102 as each is generated. As a first alternative, a set of more than one of the 32 may be provided to the PLD 102 as the set is generated. As a second alternative, all 32 may be provided to the PLD 102 after all 32 have been generated.

As another example, when the configuration array of the PLD 102 is expecting 1024 configuration bits organized as 32 configuration frames of 32 bits each, when the PLD 102 has 32 similar LABs, and when each LAB has the same used and unused configuration bit position information, then step 152 may be performed once, and steps 154 and 156 may be performed 32 times.

Although the above description has focused on specific embodiments, numerous modifications, variations and their equivalents are to be considered within the scope of the present invention, which is defined by the following claims.

What is claimed is:

1. A method of configuring a programmable logic device (PLD), comprising the steps of:
    reading a first configuration frame from said PLD, wherein said first configuration frame indicates a plurality of used and unused bits;
    reading a second configuration frame from a memory, wherein said second configuration frame is related to said first configuration frame;
    creating a third configuration frame by placing information from said second configuration frame into positions indicated by said first configuration frame; and
    configuring said PLD using said third configuration frame.

2. The method of claim 1, further comprising:
    repeating, for each frame in a configuration array, said step of reading said first configuration frame, said step of reading said second configuration frame, said step of creating, and said step of configuring.

3. The method of claim 2, wherein said configuration array comprises a plurality of configuration frames.

4. The method of claim 1, wherein said first configuration frame indicates a used bit as a '0' and an unused bit as a '1'.

5. The method of claim 1, wherein said first configuration frame comprises a plurality of position bits, wherein said second configuration frame comprises a plurality of data bits, and wherein said step of creating comprises:
    examining a position bit in said first configuration frame;
    if said position bit indicates a used bit, shifting in a corresponding data bit from said second configuration frame into a corresponding position in said third configuration frame; and
    if said position bit indicates an unused bit, padding said corresponding position in said third configuration frame with a padding bit.

6. The method of claim 1, wherein said step of reading said second configuration frame is performed after said step of reading said first configuration frame.

7. The method of claim 1, wherein said step of reading said first configuration frame is performed after said step of reading said second configuration frame.

8. The method of claim 1, wherein said step of reading said first configuration frame is performed concurrently with said step of reading said second configuration frame.

9. An apparatus for configuring a programmable logic device (PLD), comprising:
    a memory configured to store a first configuration frame; and
    a processor, coupled to said memory, configured to execute processing comprising the steps of:
        reading a second configuration frame from said PLD, wherein said second configuration frame indicates a plurality of used and unused bits;
        reading, from said memory, said first configuration frame, wherein said first configuration frame is related to said second configuration frame;
        creating a third configuration frame by placing information from said first configuration frame into positions indicated by said second configuration frame; and
        configuring said PLD using said third configuration frame.

10. The apparatus of claim 9, wherein said processor is further configured to execute processing comprising:
    repeating, for each frame in a configuration array, said step of reading said second configuration frame, said step of reading said first configuration frame, said step of creating, and said step of configuring.

11. The apparatus of claim 10, wherein said configuration array comprises a plurality of configuration frames.

12. The apparatus of claim 9, wherein said second configuration frame indicates a used bit as a '0' and an unused bit as a '1'.

13. The apparatus of claim 9, wherein said first configuration frame comprises a plurality of data bits, wherein said second configuration frame comprises a plurality of position bits, and wherein said step of creating comprises:
    examining a position bit in said second configuration frame;
    if said position bit indicates a used bit, shifting in a corresponding data bit from said first configuration frame into a corresponding position in said third configuration frame; and
    if said position bit indicates an unused bit, padding said corresponding position in said third configuration frame with a padding bit.

14. The apparatus of claim 9, wherein said step of reading said second configuration frame is performed after said step of reading said first configuration frame.

15. The apparatus of claim 9, wherein said step of reading said first configuration frame is performed after said step of reading said second configuration frame.

16. The apparatus of claim 9, wherein said step of reading said second configuration frame is performed concurrently with said step of reading said first configuration frame.

* * * * *